(12) United States Patent
Lee

(10) Patent No.: US 8,588,016 B2
(45) Date of Patent: Nov. 19, 2013

(54) SEMICONDUCTOR MEMORY DEVICE AND METHOD FOR FABRICATING THE SAME

(75) Inventor: Jae-Hyun Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 168 days.

(21) Appl. No.: 12/979,020

(22) Filed: Dec. 27, 2010

(65) Prior Publication Data
US 2012/0134192 A1 May 31, 2012

(30) Foreign Application Priority Data

Nov. 25, 2010 (KR) .................. 10-2010-0117884

(51) Int. Cl.
*G11C 7/00* (2006.01)
(52) U.S. Cl.
USPC ....... 365/200; 365/145; 365/149; 365/230.03
(58) Field of Classification Search
USPC .............................. 365/200, 145, 149, 230.06
See application file for complete search history.

(56) References Cited

U.S. PATENT DOCUMENTS 6,836,439 B1* 12/2004 Kang ........................... 365/200
2004/0051133 A1* 3/2004 Sugita et al. .................. 257/315

FOREIGN PATENT DOCUMENTS

KR 1020080069313 7/2008

OTHER PUBLICATIONS

Notice of Allowance issued by the Korean Intellectual Property Office on Apr. 30, 2012.

* cited by examiner

*Primary Examiner* — Jason Lappas
(74) *Attorney, Agent, or Firm* — IP & T Group LLP

(57) ABSTRACT

A semiconductor memory device includes: a plurality of mats; a plurality of sense amplifier regions disposed on a side of the plurality of mats; and a plurality of main bit lines overlapping with a plurality of secondary bit lines, respectively, in regions for the plurality of mats, wherein the plurality of main bit lines and the plurality of secondary bit lines are formed in regions for the plurality of mats and the plurality of sense amplifier regions.

21 Claims, 12 Drawing Sheets

SEMICONDUCTOR MEMORY DEVICE AND METHOD FOR FABRICATING THE SAME

CROSS-REFERENCE TO RELATED APPLICATIONS

The present application claims priority of Korean Patent Application No. 10-2010-0117884, filed on Nov. 25, 2010, which is incorporated herein by reference in its entirety.

BACKGROUND OF THE INVENTION

Exemplary embodiments of the present invention relate to a semiconductor device fabrication technology, and more particularly, to a semiconductor memory device including double bit lines and a method for fabricating the semiconductor memory device.

A semiconductor memory device such as a Dynamic Random Access Memory (DRAM) device includes a plurality of banks, where each bank includes a plurality of mats (that is, matrixes) and a plurality of sense amplifier regions. Here, each mat includes a plurality of word lines and a plurality of bit lines, and each sense amplifier region includes a plurality of sense amplifiers (SA), each of which is coupled with a bit line extending from a mat and detects a stored data. The structure of bit lines are divided into a folded bit line structure and an open bit line structure depending on different ways that a bit line is coupled with a sense amplifier. As the integration degree of a semiconductor memory device increases, the open bit line structure is being used more extensively.

A sense amplifier may be coupled with two bit lines, which include a main bit line BL and a line /BL. While a sense amplifier operates, a reference voltage may be applied to the secondary bit line /BL and a data voltage higher or lower than the reference voltage is applied to the main bit line according to the data stored in a corresponding mat. Here, the sense amplifier reads the stored data by amplifying the voltage difference between the main bit line and the secondary bit line.

However, in a conventional semiconductor memory device having the open bit line structure, a main bit line and a secondary bit line coupled with a sense amplifier are supplied from different mats. Therefore, the reference voltage applied to the secondary bit line is changed due to the noise applied to each mat, and this leads to deteriorated operation characteristics of the sense amplifier.

Also, each of the mats of a semiconductor memory device includes a redundancy mat. Since the main bit line and the secondary bit line are supplied from different mats in the open bit line structure, only half of a redundancy mat is actually used. Thus, a method for increasing the utility efficiency based on the area of a redundancy mat even if the size of banks is decreasing and the number of banks is increasing to realize high-speed operation is useful.

SUMMARY OF THE INVENTION

An embodiment of the present invention is directed to a semiconductor memory device for obtaining appropriate operation characteristics of a sense amplifier.

Another embodiment of the present invention is directed to a semiconductor memory device for obtaining appropriate utility efficiency based on the area of a redundancy mat.

In accordance with an embodiment of the present invention, a semiconductor memory device includes: a plurality of mats; a plurality of sense amplifier regions disposed on a side of the plurality of mats; and a plurality of main bit lines overlapping with a plurality of secondary bit lines, respectively, in regions for the plurality of mats, wherein the plurality of main bit lines and the plurality of secondary bit lines are formed in regions for the plurality of mats and the plurality of sense amplifier regions.

In accordance with another embodiment of the present invention, a method for fabricating a semiconductor memory device includes: forming a plurality of main bit lines over a substrate in regions for a plurality of mats and in a plurality of sense amplifier regions that are on a side of the plurality of mats; forming an insulation layer covering the plurality of main bit lines over the substrate; and forming over the insulation layer a plurality of secondary bit lines that overlap the plurality of main bit lines, respectively, in the regions for the plurality of mats.

In accordance with yet another embodiment of the present invention, a semiconductor memory device includes: a plurality of mats; a plurality of sense amplifier regions disposed on a side of the plurality of mats; a plurality of main bit lines formed in regions for the plurality of mats and in the plurality of sense amplifier regions; a plurality of secondary bit lines formed in the plurality of sense amplifier regions; and a plurality of voltage lines coupled with the plurality of secondary bit lines.

DESCRIPTION OF SPECIFIC EMBODIMENTS

Figure 1:
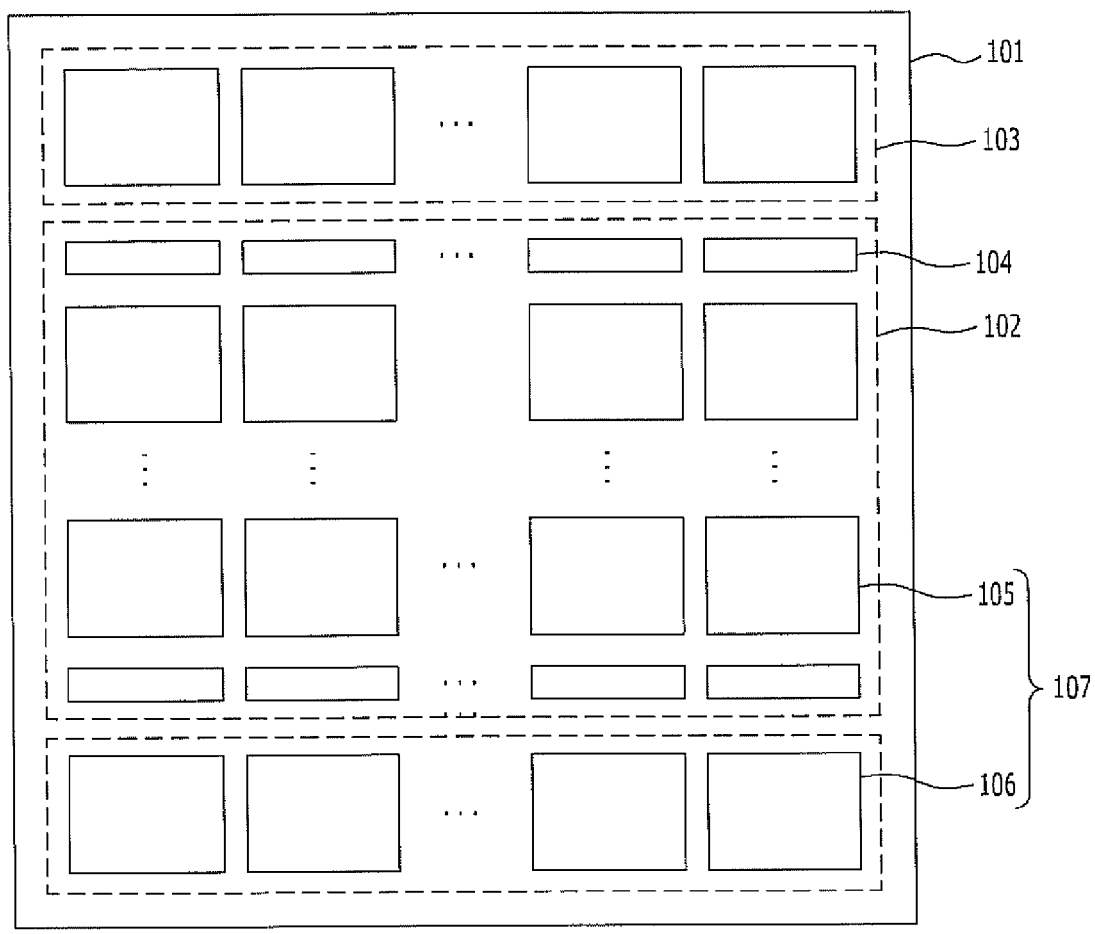
FIG. 1 is a plan view illustrating the banks of a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a plan view illustrating the banks of a semiconductor memory device in accordance with an embodiment of the present invention.

Referring to FIG. 1, the semiconductor memory device applicable for exemplary embodiments of the present invention includes a plurality of banks 101, and each bank 101 includes a cell region 102, a sense amplifier region 104, and a redundancy region 103. The cell region 102 and the redundancy region 103 include a plurality of mats 107, and each mat 107 includes a plurality of word lines and a plurality of bit lines. Hereafter, for illustration purposes, the mats 107 of the cell region 102 is referred to as cell mats 105 and the mats 107 of the redundancy region 103 is referred to as redundancy mats 106. The cell mats 105 and the redundancy mats 106 have the same structure. The sense amplifier region 104 including a plurality of sense amplifiers (SA) may be disposed between the mats 107.

The plurality of banks 101 having the above described disposition structure is just an exemplary embodiment of the present invention. The structure and the arrangement of the plurality of banks 101 constituting a semiconductor memory device may be modified as appropriate according to different design needs.

Figure 2A:
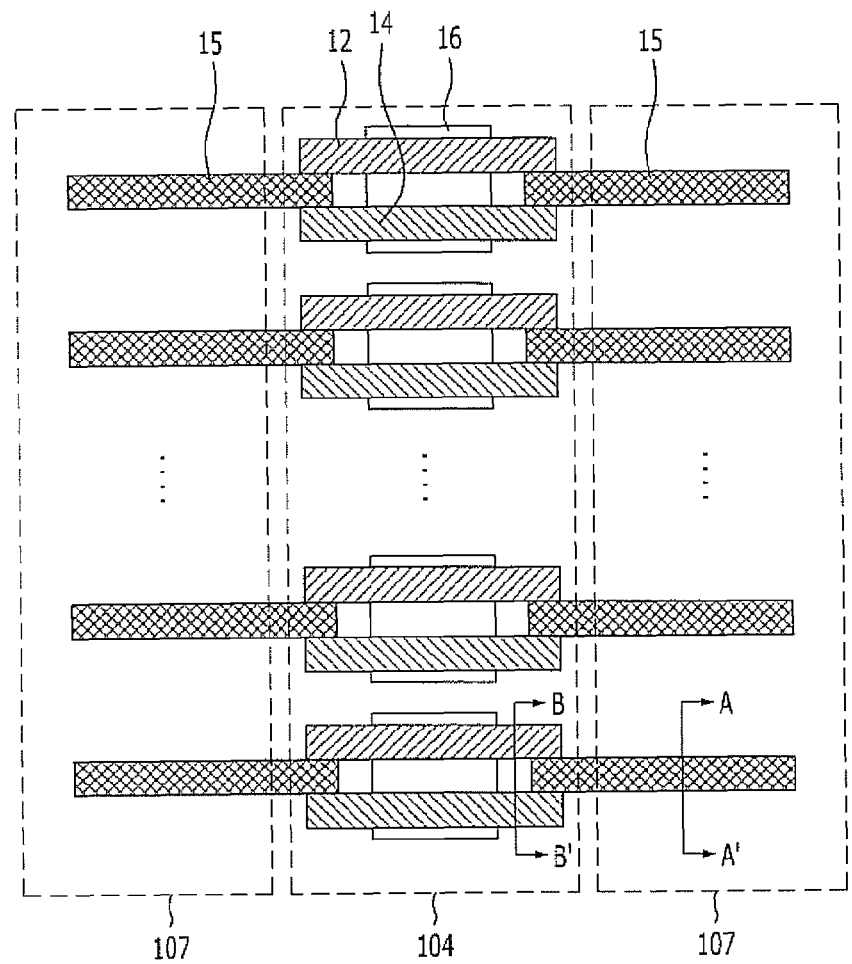
FIGS. 2A to 2C illustrate a semiconductor memory device in accordance with a first embodiment of the present invention.
Figure 2B:
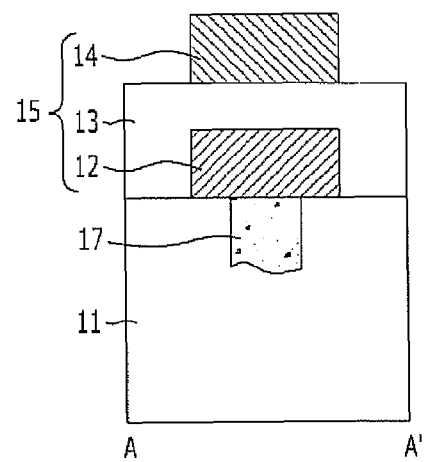
Figure 2C:
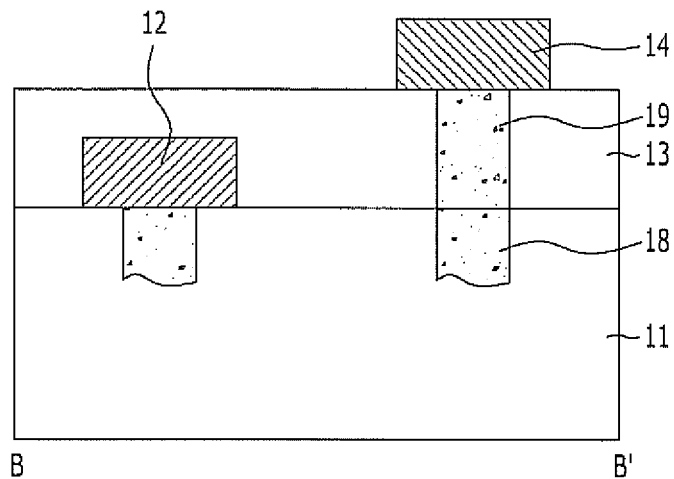

FIGS. 2A to 2C illustrate a semiconductor memory device in accordance with a first embodiment of the present invention. FIG. 2A is a plan view of the semiconductor memory device. FIG. 2B is a cross sectional view of the semiconductor memory device taken along line A-A' and FIG. 2C is a cross sectional view of the semiconductor memory device taken along line B-B'.

Referring to FIGS. 1, 2A, 2B and 2C, the semiconductor memory device includes a plurality of bit lines 15, simultaneously crossing a corresponding mat 107. Each bit line 15 has a corresponding sense amplifier region 104 disposed on one side of the mat 107. Each bit line 15 includes a main bit line 12, a secondary bit line 14, and an insulation layer 13 which electrically insulates the main bit line 12 and the secondary bit line 14 from each other. Here, the main bit line 12 and the secondary bit line 14 are overlapped in the mat 107 but not in the sense amplifier region 104.

More specifically, the bit line 15 includes the main bit line 12, the insulation layer 13, and the secondary bit line 14 that are sequentially stacked and overlapped over a substrate 11 having a desired structure formed therein in the mat 107. The substrate 11 having the desired structure formed therein includes first bit line contact plugs BLC1 17 and the main bit line 12 of the bit line 15 is formed to contact a corresponding first bit line contact plug BLC1 17.

In the sense amplifier region 104, a structure where the main bit line 12 and the insulation layer 13 are stacked or a structure where the insulation layer 13 and the secondary bit line 14 are stacked is formed over the substrate 11 having a desired structure but not in the sense amplifier region 104. Also, a plug 19 which penetrates the insulation layer 13 and electrically connects the secondary bit line 14 to the structure formed in the substrate 11 is formed in the insulation layer 13. For example, a second bit line contact plug BLC2 18 is formed in the sense amplifier region 104 of the substrate 11, and the secondary bit line 14 and the plug 19 are formed to contact the second bit line contact plug BLC2 18.

During an operation of a sense amplifier 16, a data voltage higher or lower than a reference voltage is applied to the main bit line 12 according to the data stored in the mat 107, and the reference voltage is applied to the secondary bit line 14 which is formed to be independent. Here, the secondary bit line 14 which is formed to be independent does not function as a bit line that is selected in response to a column address but functions as a conductive line for providing the reference voltage at all times. Therefore, the stacked structure of the bit line 15 having the main bit line 12 and the secondary bit line 14 may be disposed over the structure formed in the substrate 11. For example, the secondary bit line 14 may be disposed over the main bit line 12, where the main bit line 12 easily contacts the first bit line contact plug BLC1 17. The insulation layer 13 separating the main bit line 12 and the secondary bit line 14 from each other is formed of an insulation material having a low dielectric constant in order to decrease the capacitance between the main bit line 12 and the secondary bit line 14. According to an example, the insulation material having a low dielectric constant is a material having a smaller dielectric constant than a silicon oxide ($SiO_2$) layer.

The sense amplifier region 104 including a plurality of sense amplifiers 16 coupled with the plurality of bit lines 15 may be disposed between a couple of mats 107 in each direction that the plurality of bit lines 15 extend. Therefore, two mats 107 may share one sense amplifier region 104 disposed between them. In other words, in the sense amplifier region 104, a bit line 15 extended from one mat 107 and a bit line 15 extended from the other mat 107 may be coupled through a common sense amplifier 16. As described above, the structure where the mats 107 adjacent to a sense amplifier region 104 share the sense amplifier region 104 may reduce the size of banks 101 by using common sense amplifier 16.

Herein, in the above-described bank structure, the substrate 11 further includes a switch for electrically disconnecting the bit line 15 extended from a mat 107 and the sense amplifier 16 from each other while a sense amplification operation is being performed for the mat 107 on the opposite side.

As described above, when the main bit line 12 and the secondary bit line 14 are both necessarily controlled according to a column address, each of the main bit line 12 and the secondary bit line 14 requires a switch. However, according to the embodiment of the present invention, the f main bit line 12 and the secondary bit line 14 are not both necessarily controlled by a column address, and a switch may be used to couple to, for example, only the main bit line out of the bit line pair.

Since the semiconductor memory device having the above-described structure in accordance with the first embodiment of the present invention has a stacked structure (i.e., overlapped structure) where the main bit line 12 and the secondary bit line 14 are stacked in the mat 107, the size of the mat 107 may be effectively decreased. In short, the technology of the present invention may be easily applied to a $6F^2$ cell structure or a cell structure which is more integrated than the $6F^2$ cell structure, where F is a minimum feature size.

Also, since both of the main bit line 12 and the secondary bit line 14 coupled with the sense amplifier 16 are provided in the same mat 107, the operation characteristics of the sense amplifier 16 may be prevented from deteriorating due to noise. Moreover, since the secondary bit line 14 is controlled independently of column addresses, the reference voltage may be applied at all times while the sense amplifier 16 operates. Therefore, the operation characteristics of the sense amplifier 16 may be prevented from deteriorating due to noise.

Also, since both of the main bit line 12 and the secondary bit line 14 coupled with the sense amplifier 16 are provided in the same mat 107, the entire redundancy mat 106 may be used. Therefore, the area of the redundancy mat 106 may be efficiently used and the size of the semiconductor memory device may be decreased. In particular, the size of the banks 101 is decreased to achieve high-speed operation, where as the number of the banks 101 becomes larger, the size reduction of the semiconductor memory device becomes more pronounced.

Figure 3A:
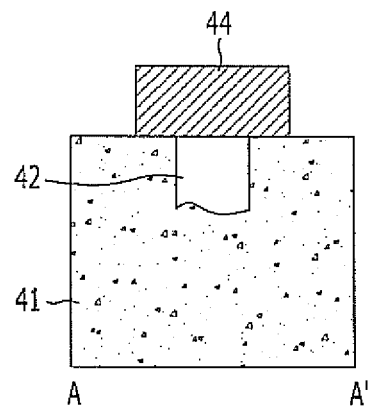
FIGS. 3A to 3F illustrate a method for fabricating the semiconductor memory device in accordance with the first embodiment of the present invention.
Figure 3B:
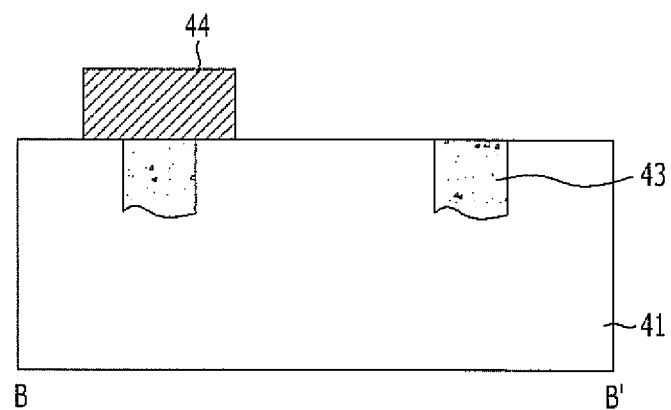
Figure 3C:
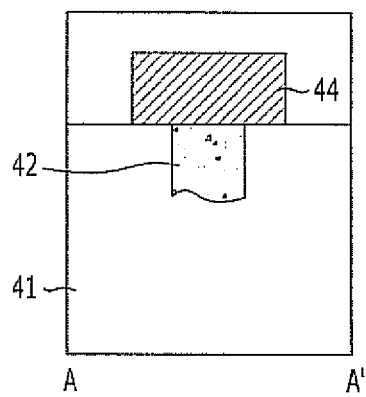
Figure 3D:
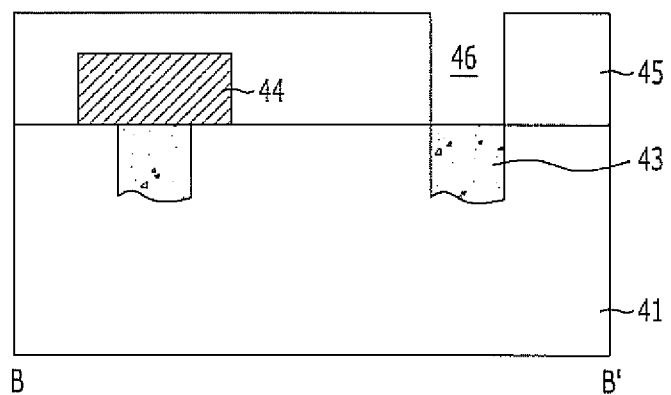
Figure 3E:
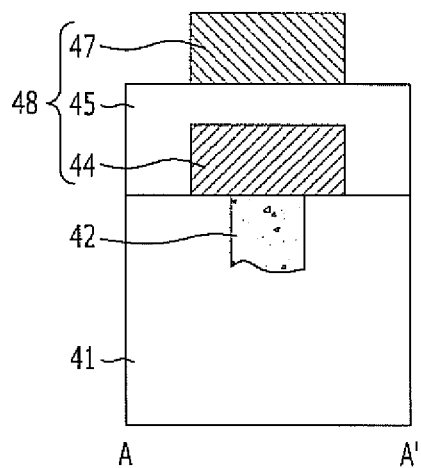
Figure 3F:
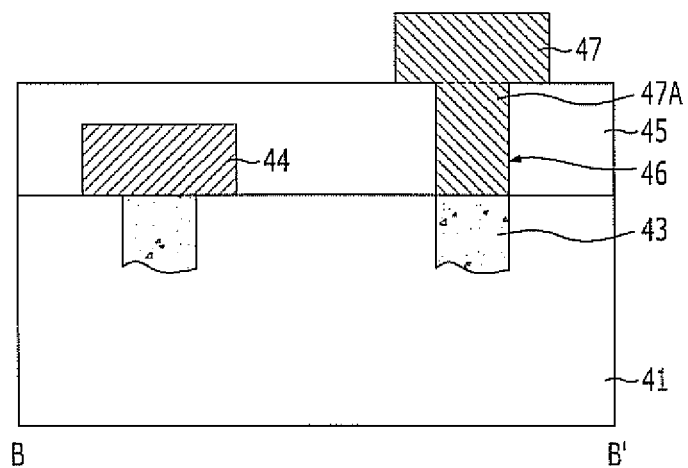

FIGS. 3A to 3F illustrate a method for fabricating the semiconductor memory device in accordance with the first embodiment of the present invention. FIGS. 3A, 3C, and 3E are cross-sectional views illustrating a method for fabricating the semiconductor memory device by cutting the semiconductor memory device along the line A-A', and FIGS. 3B, 3D, and 3F are cross-sectional views illustrating a method for fabricating the semiconductor memory device by cutting the semiconductor memory device along the line B-B'.

Referring to FIGS. 3A and 3B, a substrate 41 is provided. The substrate 41 includes a mat 107, a sense amplifier region 104, a first bit line contact plug 42 in the mat 107, a sense amplifier (not shown), and a second bit line contact plug 43.

Subsequently, after a conductive layer is deposited over the substrate 41, a main bit line 44 simultaneously crossing the mat 107 and the sense amplifier regions 104 is formed by selectively etching the conductive layer. Here, the main bit line 44 may be formed of a metal layer and formed to contact the first bit line contact plug 42 of the mat 107.

Referring to FIGS. 3C and 3D, an insulation layer 45 is formed over the substrate 41 including the main bit line 44. The insulation layer 45 electrically disconnects the main bit line 44 from a secondary bit line, which is to be formed subsequently. Here, the insulation layer 45 is formed of an insulation material having a low dielectric constant in order to decrease the capacitance between the main bit line 44 and the secondary bit line.

Subsequently, a contact hole 46 exposing the second bit line contact plug 43 to be coupled with the secondary bit line is formed by selectively etching the insulation layer 45 of the sense amplifier region 104.

Referring to FIGS. 3E and 3F, a conductive layer is deposited over the insulation layer 45 to fill the contact hole 46, and then the conductive layer is selectively etched to form a plug 47A as well as a secondary bit line 47. Here, the secondary bit line 47 may be formed of a metal layer, and it may be formed of the same material as the main bit line 44. Here, the secondary bit line 47 is formed of the same material as the main bit line 44 in order to prevent signal transfer characteristics from deteriorating due to the resistance difference between the main bit line 44 and the secondary bit line 47.

When the formation process of the secondary bit line 47 is completed, a bit line 48 has a stacked structure where the main bit line 44, the insulation layer 45 and the secondary bit line 47 are sequentially stacked in the mat 107. In the sense amplifier region 104, the main bit line 44 and the insulation layer 45 are stacked, and the insulation layer 45 and the secondary bit line 47 are stacked.

Figure 4A:
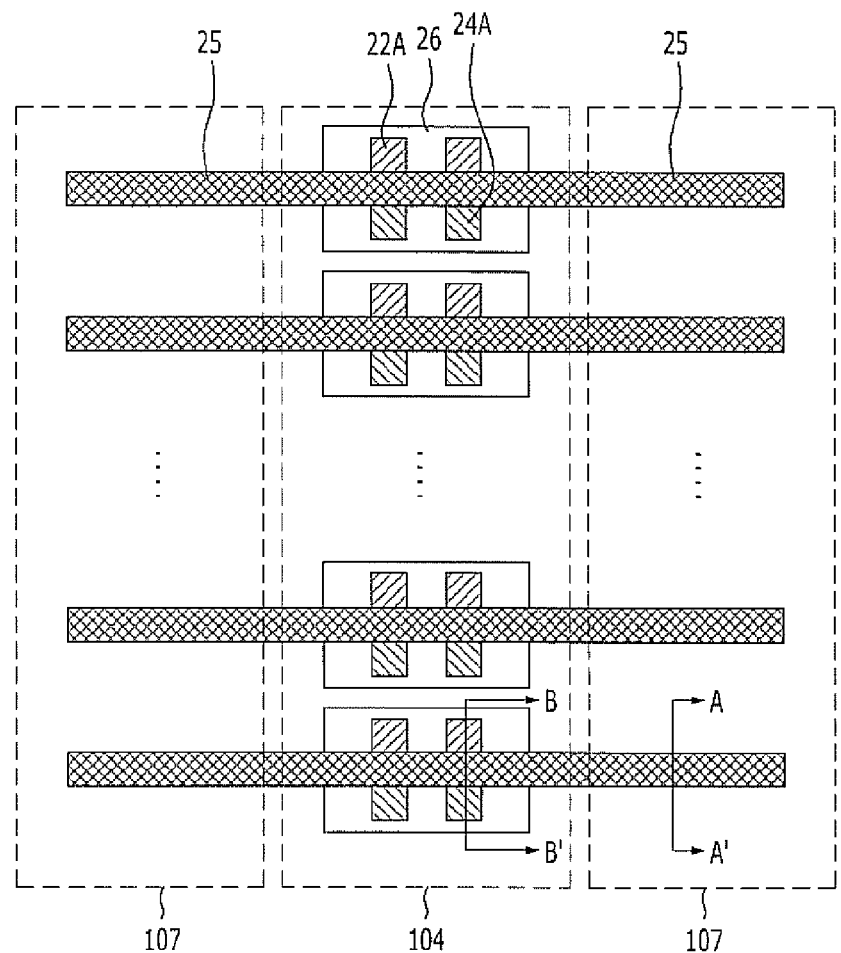
FIGS. 4A to 4C illustrate a semiconductor memory device in accordance with a second embodiment of the present invention.
Figure 4B:
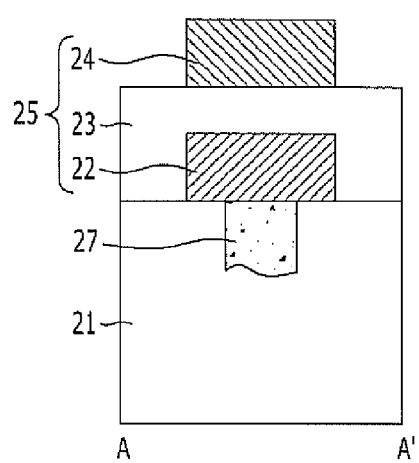
Figure 4C:
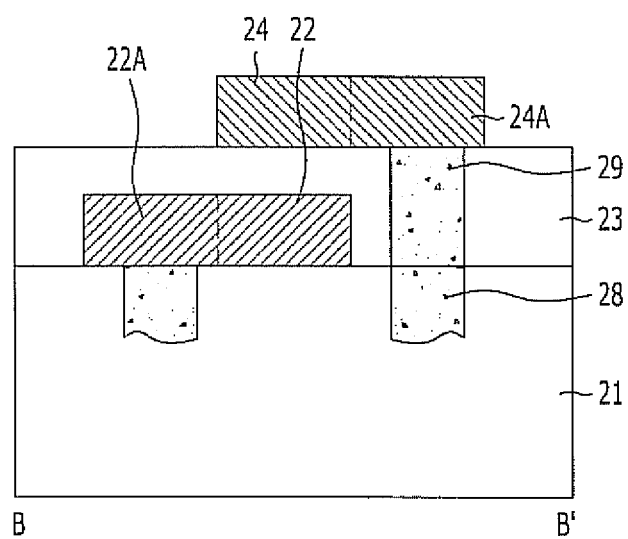

FIGS. 4A to 4C illustrate a semiconductor memory device in accordance with a second embodiment of the present invention. FIG. 4A is a plan view illustrating the semiconductor memory device in accordance with the second embodiment of the present invention. FIG. 4B is a cross-sectional view of the semiconductor memory device of FIG. 4A taken along line A-A' and FIG. 4C is a cross-sectional view of the semiconductor memory device of FIG. 4A taken along line B-B'.

Referring to FIGS. 1, 4A, 4B and 4C, the semiconductor memory device according the second embodiment of the present invention includes a plurality of bit lines 25, each simultaneously crossing a corresponding mat 107 and a corresponding sense amplifier region 104 disposed on a side of the mat 107. Each bit line 25 includes a main bit line 22, a secondary bit line 24, and an insulation layer 23 electrically disconnecting the main bit line 22 and the secondary bit line 24 from each other. Also, in the sense amplifier region 104, the main bit line 22 and the secondary bit line 24 include a first protrusion 22A protruded from the main bit line 22 and a second protrusion 24A protruded from the secondary bit line 24, respectively, to contact the structure formed in a substrate 21. Here, the main bit line 22 and the secondary bit line 24 are overlapped with each other in the mat 107 and the sense amplifier region 104, but the first protrusion 22A and the second protrusion 24A disposed in the sense amplifier region 104 are not overlapped.

More specifically, the plurality of bit lines 25 each simultaneously crossing the mat 107 and the sense amplifier region 104 have a stacked structure where the main bit line 22, the insulation layer 23 and the secondary bit line 24 are sequentially stacked over the substrate 21 having a desired structure therein. The substrate 21 of the mat 107 includes a first bit line contact plug 27, and the main bit line 22 is formed to contact the first bit line contact plug 27.

In each sense amplifier region 104, the bit line 25, which includes the main bit line 22, the insulation layer 23 and the secondary bit line 24 sequentially stacked, and the first protrusion 22A and the second protrusion 24A, which protrude from the main bit line 22 and the secondary bit line 24, respectively, and do not overlap each other, are formed over the substrate 21 having a desired structure therein. In the substrate 21 of the sense amplifier region to 104, a second bit line contact plug 28 is formed to contact the first protrusion 22A or the second protrusion 24A which are protruded from the main bit line 22 and the secondary bit line 24, respectively. Here, the second protrusion 24A protruded from the secondary bit line 24 formed over the main bit line 22 penetrates the insulation layer 23 and contacts the second bit line contact plug 28 through a plug 29.

A data voltage which is higher or lower than a reference voltage is applied to the main bit line 22 based on the data stored in the mat 107 while a sense amplifier 26 operates. Also, the reference voltage is applied to the secondary bit line 24 which is formed to operate independently of column address signals during the operation of the sense amplifier 26 at all times. Here, the independent secondary bit line 24 does not function as the main bit line 22 based on the column address but functions as a conductive line which, for example, always supplies the reference voltage. Therefore, the stacked structure of the bit line 25 may be disposed over the structure formed in the substrate 21. For example, the secondary bit line 24 may be disposed over the main bit line 22 to facilitate the contact between the first and second bit line contact plugs 27 and 28 and the main bit line 22. The insulation layer 23 separating the main bit line 22 and the secondary bit line 24 from each other is formed of an insulation material having a low dielectric constant to decrease the capacitance between the main bit line 22 and the secondary bit line 24. Here, according to an example, the insulation material having a low dielectric constant is a material having a smaller dielectric constant than a silicon oxide ($SiO_2$) layer.

The sense amplifier region 104 including a plurality of sense amplifiers 26 coupled with the plurality of bit lines 25 may be disposed between a couple of mats 107 in each direction that the plurality of bit lines 25 extend. Therefore, two mats 107 may share one sense amplifier region 104 disposed between them. In other words, in the sense amplifier region 104, a bit line 25 extended from one mat 107 and a bit line 25 extended from the other mat 107 may be coupled through a common sense amplifier 26. As described above, the structure where the mats 107 adjacent to a sense amplifier region 104 share the sense amplifier region 104 may reduce the size of banks 101 by using the common sense amplifier 16.

In the above-described bank structure, the substrate 21 further includes a switch for electrically disconnecting the bit line 25 extended from a mat 107 and the sense amplifier 26 from each other while a sense amplification operation is being performed for the mat 107 on the opposite side.

As described above, when the main bit line 22 and the secondary bit line 24 are both necessarily controlled according to a column address, each of the main bit line 22 and the secondary bit line 24 requires a switch. However, according to the embodiment of the present invention, the functions of the main bit line 22 and the secondary bit line 24 are not both necessarily controlled by a column address, and a switch may be used to couple to, for example, only the main bit line out of the bit line pair.

Since the semiconductor memory device having the above-described structure in accordance with the second embodiment of the present invention has a stacked structure (i.e., overlapped structure) where the main bit line 22 and the secondary bit line 24 are stacked in the mat 107 and the sense amplifier region 104, the size of the mat 107 may be effectively decreased. In short, the technology of the present invention may be easily applied to a 6F² cell structure or a cell structure which is more integrated than the 6F² cell structure, where F is a minimum feature size.

Also, since both of the main bit line 22 and the secondary bit line 24 coupled with the sense amplifier 26 are provided in the same mat 107, the operation characteristics of the sense amplifier 26 may be prevented from deteriorating due to noise. Moreover, since the secondary bit line 24 is controlled independently of column addresses, the reference voltage may be applied at all times while the sense amplifier 26 operates. Therefore, the operation characteristics of the sense amplifier 26 may be prevented from deteriorating due to noise.

Also, since both of the main bit line 22 and the secondary bit line 24 coupled with the sense amplifier 26 are provided in the same mat 107, the entire redundancy mat 106 may be used. Therefore, the area of the redundancy mat 106 may be efficiently used and the size of the semiconductor memory device may be decreased. In particular, the size of the banks 101 is decreased to achieve high-speed operation, where the number of the banks 101 becomes larger, the size reduction of the semiconductor memory device becomes more pronounced.

Figure 5A:
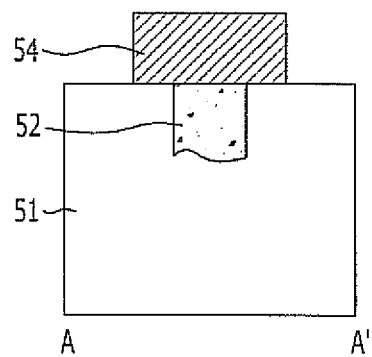
FIGS. 5A to 5F illustrate a method for fabricating the semiconductor memory device in accordance with the second embodiment of the present invention.
Figure 5B:
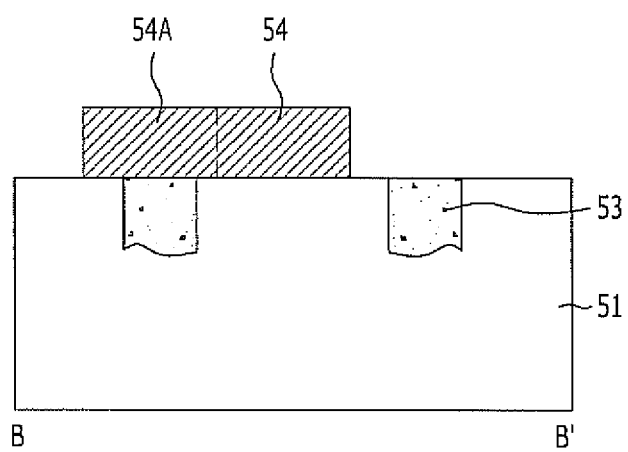
Figure 5C:
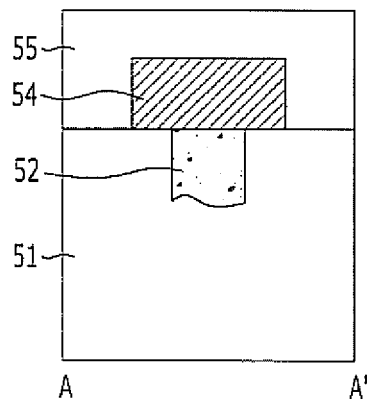
Figure 5D:
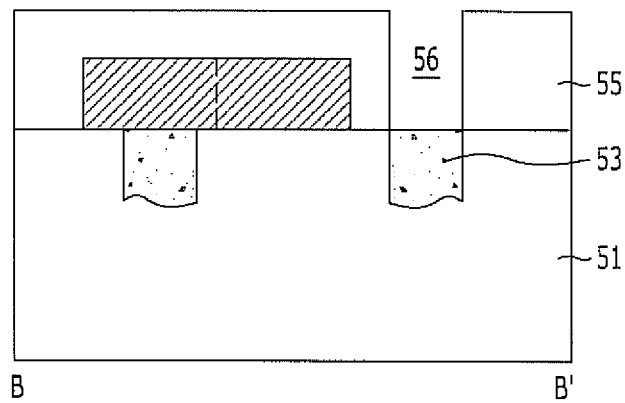
Figure 5E:
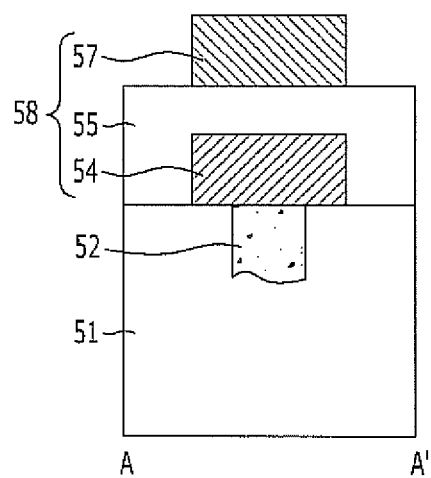
Figure 5F:
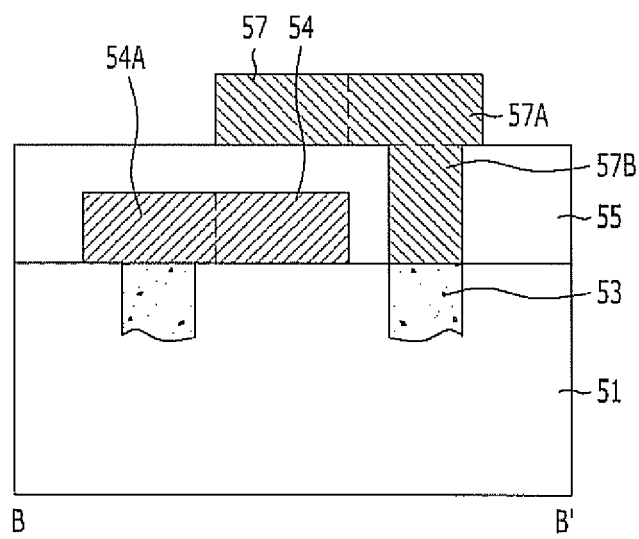

FIGS. 5A to 5F illustrate a method for fabricating the semiconductor memory device in accordance with the second embodiment of the present invention. FIGS. 5A, 5C, and 5E are cross-sectional views illustrating a method for fabricating the semiconductor memory device by cutting the semiconductor memory device of FIG. 4A along the line A-A', and FIGS. 5B, 5D, and 5F are cross-sectional views illustrating a method for fabricating the semiconductor memory device by cutting the semiconductor memory device of FIG. 4A along the line B-B'.

Referring to FIGS. 5A and 5B, a substrate 51 is provided. The substrate 51. includes a mat 107, a sense amplifier region 104, a first bit line contact plug 52 in the mat 107, a sense amplifier (not shown), and a second bit line contact plug 53.

Subsequently, after a conductive layer is deposited over the substrate 51, a main bit line 54 simultaneously crossing the mat 107 and the sense amplifier regions 104 is formed by selectively etching the conductive layer and at the same time, a first protrusion 54A protruded from a main bit line 54 is formed in the sense amplifier region 104. Here, the main bit line 54 and the first protrusion 54A may be formed of a metal layer and formed to contact the first bit line contact plug 52 in the mat 107

Referring to FIGS. 5C and 5D, an insulation layer 55 is formed over the substrate 51 including the main bit line 54. The insulation layer 55 electrically disconnects the main bit line 54 from a secondary bit line, which is to be formed subsequently. Here, the insulation layer 55 is formed of an insulation material having a low dielectric constant in order to decrease the capacitance between the main bit line 54 and the secondary bit line.

Subsequently, a contact hole 56 exposing the second bit line contact plug 53 to be coupled with the secondary bit line is formed by selectively etching the insulation layer 55 of the sense amplifier region 104.

Referring to FIGS. 5E and 5F, a conductive layer is deposited over the insulation layer 55 to fill the contact hole 56, and then the conductive layer is selectively etched to form a plug 57B as well as a secondary bit line 57 which simultaneously crosses the mat 107 and the sense amplifier region 104 and a second protrusion 57A which is extended from the secondary bit line 57 in the sense amplifier region 104. Here, the plug 57B coupled with the second bit line contact plug 53 in the sense amplifier region 104 may be formed to contact the second protrusion 57A.

The secondary bit line 57, the second protrusion 57A, and the plug 57B may be formed of a metal layer, and it may be formed of the same material as the main bit line 54 and the first protrusion 54A. Here, the secondary bit line 57 is formed of the same material as the main bit line 54 in order to prevent signal transfer characteristics from deteriorating due to the resistance difference between the main bit line 54 and the secondary bit line 57.

When the formation process of the secondary bit line 57 is completed, a bit line 58 simultaneously crossing the mat 107 and the sense amplifier region 104 has a stacked structure where the main bit line 54, the insulation layer 55 and the secondary bit line 57 are sequentially stacked. In the sense amplifier region 104, the first and second protrusions 54A and 57A which protrude from the main bit line 54 and the secondary bit line 57 do not overlap and are coupled with a lower structure.

Figure 6A:
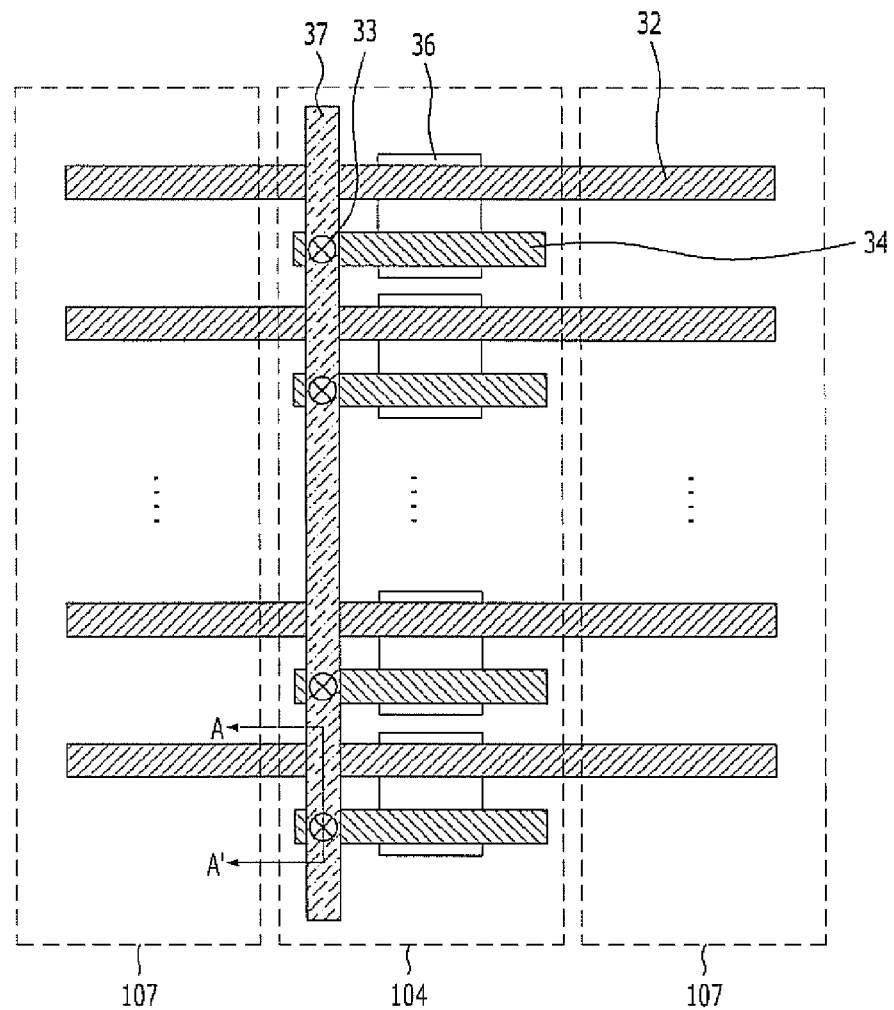
FIGS. 6A and 6B illustrate a semiconductor memory device in accordance with a third embodiment of the present invention.
Figure 6B:
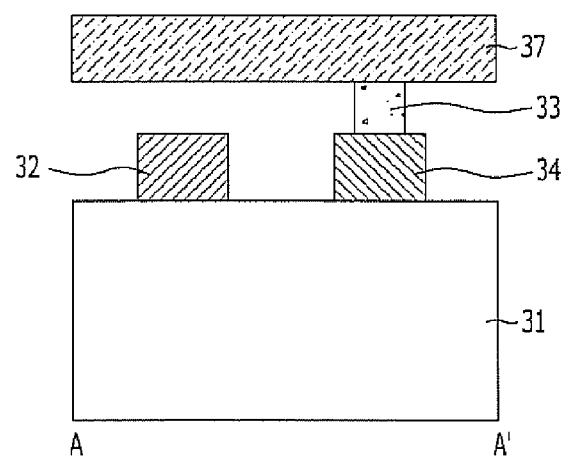

FIGS. 6A to 6C illustrate a semiconductor memory device in accordance with a third embodiment of the present invention. FIG. 6A is a plan view illustrating the semiconductor memory device in accordance with the third embodiment of the present invention. FIG. 6B is a cross-sectional view of the semiconductor memory device of FIG. 5A taken along a line A-A'.

Referring to FIGS. 1, 6A and 6B, the semiconductor memory device according the third embodiment of the present invention includes a plurality of main bit lines 32, each simultaneously crossing a corresponding mat 107 and a corresponding sense amplifier region 104 disposed on a side of the mat 107, a plurality of secondary bit lines 34 formed in sense amplifier regions 104, and a plurality of lines 37 coupled with the secondary bit lines 34 through plugs 33. Contacts are disposed in an area where the plurality of main bit lines 32 and the plurality of secondary bit lines 34 are overlapped with a plurality of sense amplifiers 36.

A reference voltage is applied to the plurality of secondary bit lines 34 through the plurality of lines 37 during an operation, and a data voltage which is higher or lower than the reference voltage is applied to the plurality of main bit lines 32 based on the data stored in the mats 107. Here, the plurality of lines 37 may be metal lines of a semiconductor memory device to apply the reference voltage to the plurality of secondary bit lines 34. The plurality of lines 37 have a structure where they are coupled with the plurality of secondary bit lines 34 according to each mat, each bank, or each column address. The plurality of secondary bit lines 34 are formed to be independent in the sense amplifier regions 104, and they may be simultaneously formed when the plurality of main bit lines 32 are formed.

The sense amplifier region 104 including the plurality of sense amplifiers 36 coupled with the plurality of main bit lines 32 may be disposed between a couple of mats 107 in each direction that the plurality of main bit lines 32 extend. Therefore, two mats 107 may share one sense amplifier region 104 disposed between them. In other words, in the sense amplifier region 104, a bit line 15 extended from one mat 107 and a main bit line 32 extended from the other mat 107 may be coupled through a common sense amplifier 36. As described above, the structure where the mats 107 adjacent to a sense amplifier region 104 share the sense amplifier region 104 may reduce the size of banks 101 by using the common sense amplifier.

In the above bank structure, the substrate 31 further includes a switch for electrically disconnecting the main bit line 32 extended from a mat 107 and the sense amplifier 36 from each other while a sense amplification operation is being performed for the mat 107 on the opposite side.

Since the semiconductor memory device having the above-described structure in accordance with the third embodiment of the present invention does not have the plurality of sub bit lines 34 disposed in the mats 107, the size of the mats 107 may be effectively decreased. In short, the technology of the present invention may be easily applied to a 6F² cell structure or a cell structure which is more integrated than the 6F² cell structure.

Also, in the sense amplifier regions 104, since the plurality of secondary bit lines 34 coupled with the plurality of sense amplifiers 36 are not extended from neighboring mats 107 and formed to be independent inside the sense amplifier regions 104, the operation characteristics of the sense amplifiers 36 may be prevented from deteriorating due to noise. Also, the reference voltage may be applied to the plurality of secondary bit lines 34 at all times while the sense amplifiers 36 operate, operation characteristics of the plurality of sense amplifiers 26 may be prevented from deteriorating due to noise.

Also, since the plurality of secondary bit lines 34 are formed to be independent inside the sense amplifier regions 104 and the reference voltage is applied to the plurality of secondary bit lines 34 through the plurality of lines 37, it is relatively easy to trim the reference voltage and the trimmed reference voltage may be applied individually or on the basis of a desired unit, for example, each mat, each bank, or each column address. In this way, the operation of the sense amplifiers may be improved.

Also, in the sense amplifier regions 104 since the plurality of secondary bit lines 34 coupled with the plurality of sense amplifiers 36 are not extended from the neighboring mats 107 but formed to be independent inside the sense amplifier regions 104, the entire redundancy mats 106 may be used. Therefore, the area of the redundancy mat 106 may efficiently used and the size reduction of the semiconductor memory device may be obtained. In particular, as the size of the banks 101 is decreased to achieve high-speed operation and as the number of the banks 101 is increased, the size reduction of the semiconductor memory device become more pronounced.

According to the technology of the present invention, the size of mats may be effectively decreased by providing a double bit line having a stacked structure where a main bit line and a secondary bit line are stacked, that is, an overlapped structure.

Also, since the same mat provides both main bit line and secondary bit line that are coupled with a sense amplifier, operation characteristics of a sense amplifier may be prevented from deteriorating due to noise.

Also, according to the technology of the present invention, since a secondary bit line is formed to be independent and a reference voltage may be applied at all times during the operation of a sense amplifier the operation characteristics of the sense amplifier may be prevented from deteriorating due to noise.

In addition, since the same mat provides both main bit line and secondary bit line that are coupled with a sense amplifier and thus the entire redundancy mat may be used, the area of the redundancy mat may be efficiently used and the size reduction of a semiconductor memory device may be obtained.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a plurality of mats extending in a first direction;
a plurality of sense amplifier regions disposed on a side of the plurality of mats; and
a plurality of main bit lines extending in the first direction, the plurality of main bit lines overlapping, in a second direction that is different than the first direction, a corresponding plurality of secondary bit lines in regions having the plurality of mats, wherein the plurality of main bit lines and the plurality of corresponding secondary bit lines are formed in regions having the plurality of mats and the plurality of sense amplifier regions.

2. The semiconductor memory device of claim 1, wherein the plurality of main bit lines do not overlap the corresponding plurality of secondary bit lines in the plurality of sense amplifier regions.

3. The semiconductor memory device of claim 1, wherein, in each sense amplifier region, each main bit line, of the plurality of main bit lines, comprises a first protrusion extending from the main bit line, and
wherein, in each sense amplifier region, each secondary bit line, of the corresponding plurality of secondary bit lines, comprises a second protrusion extending from the secondary bit line.

4. The semiconductor memory device of claim 3, wherein, in the plurality of sense amplifier regions, the plurality of main bit lines overlap the corresponding plurality of secondary bit lines and the first protrusions do not overlap the second protrusions.

5. The semiconductor memory device of claim 1, wherein the corresponding plurality of secondary bit lines are stacked over the plurality of main bit lines.

6. The semiconductor memory device of claim 1, wherein each sense amplifier region, of the plurality of sense amplifier regions, is disposed between two mats, of the plurality of mats, so that the two mats share the sense amplifier region.

7. The semiconductor memory device of claim 6, further comprising:
a plurality of switches, each of which is coupled with a corresponding main bit line, of the plurality of main buts lines, and is configured to electrically disconnect a corresponding mat, of the plurality of mats, and a corresponding sense amplifier region, of the plurality of sense amplifier regions, from each other.

8. The semiconductor memory device of claim 1, wherein each mat, of the plurality of mats, comprises a redundancy mat.

9. The semiconductor memory device of claim 1, further comprising:
an insulation layer interposed between each main bit line, of the plurality of main bit lines, and a corresponding secondary bit lines, of the corresponding plurality of secondary bit lines.

10. The semiconductor memory device of claim 9, wherein the insulation layer comprises an insulation material having a low dielectric constant.

11. The semiconductor memory device of claim 1, wherein the plurality of main bit lines are to be controlled in response to column addresses, and the corresponding plurality of secondary bit lines are not to be controlled in response to the column addresses.

12. The semiconductor memory device of claim 11, wherein the plurality of main bit lines are to receive voltages to indicate data carried on the main bit lines, and the corresponding plurality of secondary bit lines are arranged to receive a reference voltage that does not change in response to the column addresses.

13. The semiconductor memory device of claim 1, wherein the first direction and the second direction are substantially perpendicular each other.

14. A method for fabricating a semiconductor memory device, the method comprising:
forming a plurality of main bit lines, the plurality of main bit lines extending in a first direction over regions of a substrate having a plurality of mats, and over a plurality of sense amplifier regions that are on a side of the plurality of mats;
forming an insulation layer covering the plurality of main bit lines; and
forming over the insulation layer, a corresponding plurality of secondary bit lines that overlap, in a second direction that is different than the first direction, the plurality of main bit lines, in the plurality of regions having the plurality of mats.

15. The method of claim 14, wherein the plurality of main bit lines do not overlap the plurality of secondary bit lines in the plurality of sense amplifier regions.

16. The method of claim 14, wherein the forming the plurality of secondary bit lines comprises:
forming a plurality of contact holes exposing the substrate by selectively etching the insulation layer in the plurality of sense amplifier regions;
forming a conductive layer over the insulation layer to fill the plurality of contact holes; and
simultaneously forming the plurality of secondary bit lines and a plurality of plugs by selectively etching the conductive layer.

17. The method of claim 14, wherein, in each sense amplifier region, each main bit line, of the plurality of main bit lines, comprises a first protrusion extending from the main bit line, and
wherein, in each sense amplifier region, each secondary bit line, of the corresponding plurality of plurality of secondary bit lines, comprises a second protrusion extending from the secondary bit line.

18. The method of claim 17, wherein, in the plurality of sense amplifier regions, the plurality of main bit lines overlap the corresponding plurality of secondary bit lines and the first protrusions do not overlap the second protrusions.

19. The method of claim 14, wherein the plurality of main bit lines and the corresponding plurality of secondary bit lines are formed of a same material.

20. The method of claim 14, wherein the insulation layer is formed of an insulation material having a low dielectric constant.

21. The method of claim 14, wherein the first direction and the second direction are substantially perpendicular each other.

* * * * *